(12) United States Patent
Li et al.

(10) Patent No.: US 12,087,876 B2
(45) Date of Patent: Sep. 10, 2024

(54) MICRO-ELECTRONIC ELEMENT TRANSFER METHOD

(71) Applicant: PlayNitride Display Co., Ltd., MiaoLi County (TW)

(72) Inventors: Yun-Li Li, MiaoLi County (TW); Yi-Chun Shih, MiaoLi County (TW)

(73) Assignee: PlayNitride Display Co., Ltd., MiaoLi County (TW)

( * ) Notice: Subject to any disclaimer, the term of this patent is extended or adjusted under 35 U.S.C. 154(b) by 0 days.

(21) Appl. No.: 18/464,297

(22) Filed: Sep. 11, 2023

(65) Prior Publication Data

US 2023/0420601 A1 Dec. 28, 2023

Related U.S. Application Data

(62) Division of application No. 17/087,632, filed on Nov. 3, 2020, now Pat. No. 11,799,052.

(30) Foreign Application Priority Data

Jul. 24, 2020 (TW) .................................. 109125053

(51) Int. Cl.
*H01L 33/00* (2010.01)
*H01L 33/48* (2010.01)
*H01L 33/62* (2010.01)
*H01L 33/64* (2010.01)

(52) U.S. Cl.
CPC .......... *H01L 33/005* (2013.01); *H01L 33/486* (2013.01); *H01L 33/62* (2013.01); *H01L 33/642* (2013.01); *H01L 2933/0066* (2013.01)

(58) Field of Classification Search
CPC ..... H01L 33/005; H01L 33/486; H01L 33/62; H01L 33/642; H01L 2933/0066; H01L 21/67144; H01L 21/67115; H01L 33/0095
See application file for complete search history.

(56) References Cited

U.S. PATENT DOCUMENTS

2017/0282533 A1* 10/2017 Sakurada ................ B41J 2/0057
2019/0300289 A1* 10/2019 Cok .................. H01L 21/67121

* cited by examiner

*Primary Examiner* — Ratisha Mehta
(74) *Attorney, Agent, or Firm* — JCIPRNET

(57) ABSTRACT

A micro-electronic element transfer apparatus including a first conveyer portion, a second conveyer portion, and a light source device is provided. The first conveyer portion is configured to output a plurality of micro-electronic elements. The second conveyer portion includes a first rolling component and a substrate. The substrate is disposed on the first rolling component and is moved through rolling of the first rolling component. A plurality of bumps are disposed on the substrate. The light source device is configured to irradiate the bumps for heating, and the bumps generate a phase transition. When the micro-electronic elements are outputted from the first conveyer portion, a connection force between the micro-electronic elements and the first conveyer portion is less than a connection force between the micro-electronic elements and the bumps. The micro-electronic elements are respectively bonded to the bumps. A micro-electronic element transfer method is also provided.

8 Claims, 11 Drawing Sheets

MICRO-ELECTRONIC ELEMENT TRANSFER METHOD

CROSS-REFERENCE TO RELATED APPLICATION

This application is a divisional application of U.S. application Ser. No. 17/087,632, filed on Nov. 3, 2020, which claims the priority benefit of Taiwan application serial no. 109125053, filed on Jul. 24, 2020. The entirety of each of the above-mentioned patent applications is hereby incorporated by reference herein and made a part of this specification.

BACKGROUND

Technical Field

The disclosure relates to an element transfer apparatus and an element transfer method, and in particular, to a micro-electronic element transfer apparatus and a micro-electronic element transfer method.

Description of Related Art

In a process, an apparatus is needed most of the time to transfer the required micro elements onto a target substrate and connect the micro elements to other elements on the substrate. For instance, mass transfer is performed on micro light-emitting diodes (micro LEDs) to be disposed on the substrate, and the micro LEDs are electrically connected to the bumps which are disposed on the substrate in advance. At present, the micro LEDs on the carrier may be transferred to the substrate by means of an action-at-a-distance force such as an electrostatic force or a magnetic force. Nevertheless, the number of micro LEDs transmitted through the above manner is limited by the size of the electrostatic head or the magnetic head, so the transmission efficiency may not be effectively improved, and requirement for mass transfer is not satisfied. Further, because the electron elements have been reduced to the micron level, the transfer error of micro-electronic elements is more likely to be caused by the movement error of the apparatus itself between different transfer processes (disposition position error of micro-electronic elements after being transferred). A transfer apparatus and a transfer method exhibiting high efficiency and high accuracy are thereby needed.

SUMMARY

The disclosure provides a micro-electronic element transfer apparatus and a micro-electronic element transfer method exhibiting high transfer efficiency and favorable transfer accuracy.

According to an embodiment of the disclosure, a micro-electronic element transfer apparatus including a first conveyer portion, a second conveyer portion, and a light source device is provided. The first conveyer portion is configured to output a plurality of micro-electronic elements. The second conveyer portion includes a first rolling component and a substrate. The substrate is disposed on the first rolling component and is moved through rolling of the first rolling component. A plurality of bumps are disposed on the substrate. The light source device is configured to irradiate the bumps for heating, and the bumps generate a phase transition. When the micro-electronic elements are outputted from the first conveyer portion, a connection force between the micro-electronic elements and the first conveyer portion is less than a connection force between the micro-electronic elements and the bumps. The micro-electronic elements are respectively bonded to the bumps.

According to an embodiment of the disclosure, a micro-electronic element transfer method is provided and includes the following steps. A first conveyer portion is configured to output a plurality of micro-electronic elements. A substrate is disposed on a first rolling component and is moved through rolling of the first rolling component. A plurality of bumps are disposed on the substrate. The bumps are irradiated by a light source device for heating so that the bumps generate a phase transition. Further, when the micro-electronic elements are outputted from the first conveyer portion, a connection force between the micro-electronic elements and the first conveyer portion is less than a connection force between the micro-electronic elements and the bumps. The micro-electronic elements are respectively bonded to the bumps, so that the micro-electronic elements are disposed on the substrate.

To sum up, in the micro-electronic element transfer apparatus and the micro-electronic element transfer method provided by the disclosure, the first conveyer portion is configured to output the micro-electronic elements, the substrate is configured to convey the bumps, and the light source device is configured to heat and soften the bumps to generate a phase transition. Therefore, the micro-electronic elements are disposed on the substrate through the bumps, the micro-electronic elements are efficiently transferred from the first conveyer portion to the substrate, and favorable transfer accuracy (position accuracy) of the micro-electronic elements is provided.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1A:
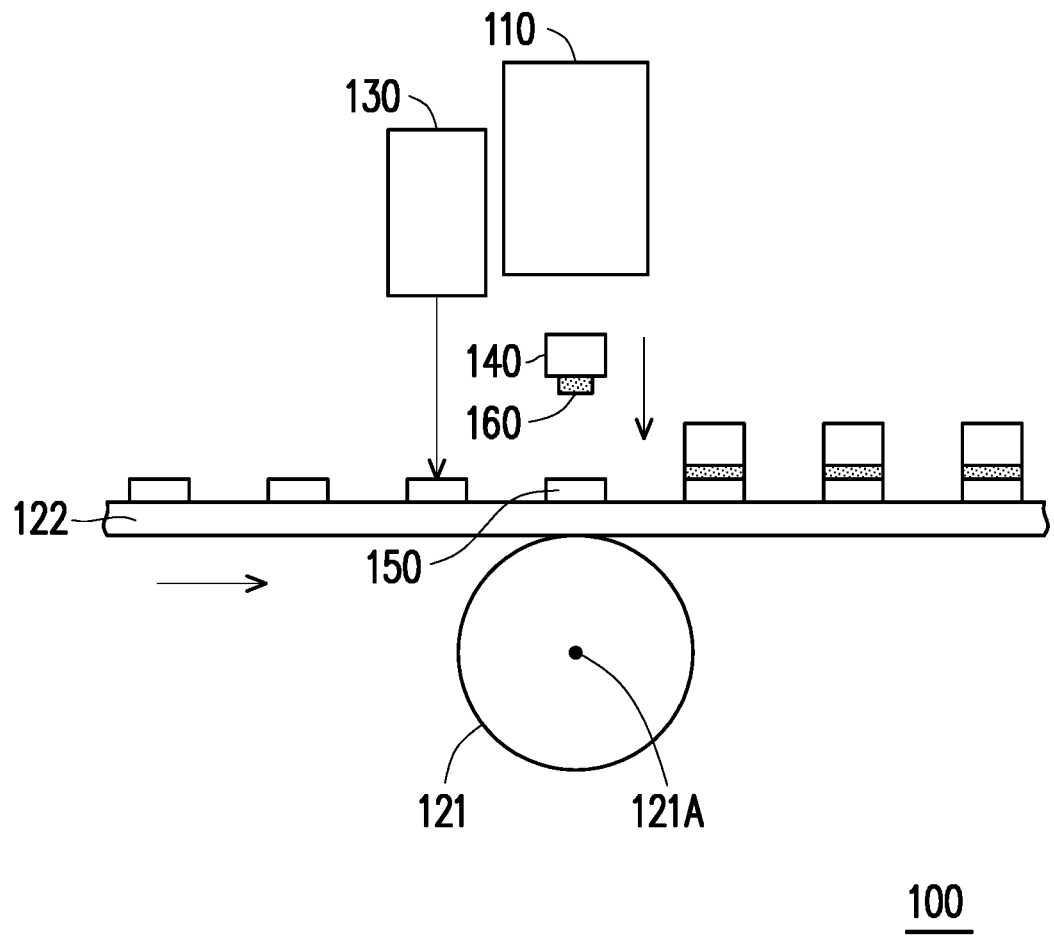
FIG. 1A is a schematic view of a micro-electronic element transfer apparatus according to a first embodiment of the disclosure.

With reference to FIG. 1A which illustrates a schematic view of a micro-electronic element transfer apparatus according to a first embodiment of the disclosure. A micro-electronic element transfer apparatus 100 includes a first conveyer portion 110, a second conveyer portion 120, and a light source device 130. The first conveyer portion 110 is configured to output a plurality of micro-electronic elements 140. According to an embodiment of the disclosure, the micro-electronic elements 140 may be photo-electric elements, for example, micro light-emitting diodes or other micro light-emitting elements. In this embodiment, one single micro-electronic element 140 outputted from the first conveyer portion 110 is depicted as representation. According to an embodiment of the disclosure, the first conveyer portion 110 may include a plurality of output holes to output a plurality of micro-electronic elements 140 at the same time. According to another embodiment of the disclosure, the first conveyer portion 110 may include a conveyer belt, and a plurality of micro-electronic elements 140 are disposed on the conveyer belt. These micro-electronic elements 140 may be detached from the conveyer belt in batches to be outputted from the first conveyer portion 110.

The second conveyer portion 120 includes a rolling component 121 and a substrate 122. The substrate 122 is disposed on the rolling component 121 and is moved to the right through rolling of the rolling component 121. To be specific, the rolling component 121 has a rolling component axle center 121A, the rolling component axle center 121A does not move, and the rolling component 121 rolls (or rotates) with respect to the rolling component axle center 121A.

A plurality of bumps 150 are disposed on the substrate 122. When the substrate 122 is viewed from the top, the plurality of bumps 150 disposed thereon may be arranged in a straight line or in a matrix. According to an embodiment of the disclosure, the first conveyer portion 110 may include a plurality of output holes, the bumps 150 on the substrate 122 are arranged in a matrix, and the output holes of the first conveyer portion 110 correspond to the matrix.

The light source device 130 is configured to irradiate the bumps 150 on the substrate 122 for heating, so that the bumps 150 may generate a phase transition, for example, the bumps 150 may be softened to facilitate subsequent bonding. In this embodiment, the light source device 130 is, for example, a laser device. Owing to a characteristic of precise light emitting in space provided by the light source device 130, the bumps 150 to be heated and softened may be precisely aligned. In addition, the light source device 130 may use a beam splitter or other optical elements to split light generated by the light source device 130 itself, so as to generate a plurality of light beams at the same time and heat a plurality of bumps 150 at the same time. According to an embodiment of the disclosure, the light source device 130 heats the bumps 150 to a temperature range greater than a glass transition temperature ($T_g$) of the bumps 150 and less than a melting point ($T_m$) of the bumps 150 to soften the bumps 150. As such, the phase transition of the bumps 150 is between a glassy state and a molten liquid state and turns into a plastic state, a high viscosity state, or a rubber state. Nevertheless, the bumps 150 are not heated to a temperature greater than the melting point and thus are prevented from overflowing to other bumps 150, but the disclosure is not limited thereto.

When a plurality of micro-electronic elements 140 are outputted from the first conveyer portion 110, since one or several bumps 150 on the substrate 122 are heated by the light source device 130 and are softened, a connection force between theses micro-electronic elements 140 and the first conveyer portion 110 is less than a connection force between these micro-electronic elements 140 and the bumps 150. As such, the micro-electronic elements 140 outputted by the first conveyer portion 110 are respectively allowed to be bonded to the softened bumps 150 and are securely transferred onto the substrate 122. In addition, the substrate 122 is moved to the right along with rolling of the rolling component 121. In this way, the light source device 130 may heat different bumps 150, and the heated bumps 150 are further bonded to the micro-electronic elements 140 continuously outputted by the first conveyer portion 110.

According to the present embodiment, in the micro-electronic element transfer apparatus 100, the first conveyer portion 110 is used to output a plurality of micro-electronic elements 140, the substrate 122 is used to convey a plurality of bumps 150, and these micro-electronic elements 140 are bonded to these bumps 150. In this way, these micro-electronic elements 140 are transferred onto the substrate 122 from the first conveyer portion 110, and mass transfer is thereby efficiently achieved. Further, in the micro-electronic element transfer apparatus 100, owing to the characteristic of precise light emitting in space, the light source device 130 is used to precisely heat and soften the bumps 150. As such, the micro-electronic elements 140 are allowed to securely disposed onto the substrate 122, and accuracy of mass transfer is thereby enhanced. Herein, the substrate 122 is implemented as a thin film transistor (TFT) substrate. In other embodiments, the substrate 122 may be a glass substrate, a ceramic substrate, a semiconductor substrate, a submount substrate, a complementary metal-oxide-semiconductor (CMOS) circuit substrate, a liquid crystal on silicon (LCOS) substrate, or a substrate configured with a driver unit. The bumps 150 may be made of a metal or an alloy with a melting point lower than 200 degrees Celsius, such as indium, an indium-bismuth alloy, a tin-bismuth alloy, a lead-tin alloy, a zinc-tin alloy, and the like, but the disclosure is not limited thereto. Through the micro-electronic element transfer apparatus 100, the micro-electronic elements 140 are electrically connected to the substrate 122, and a micro light emitting element display device (not shown), for example, is thereby completed. In other embodiments, the substrate 122 is implemented as a carrier without wire in a mass transfer process, such as a sapphire substrate or a glass substrate. The bumps 150 may be made of an organic material, for example, a high molecular polymer with stickiness, such as epoxy resin, polyimide, polyester, polyurethane, benzocyclobutene, polyethylene, polypropylene, polyacrylate, and a combination of the foregoing. Through the micro-electronic element transfer apparatus 100, the micro-electronic elements 140 are temporarily disposed on the substrate 122 for the preparation of the subsequent mass transfer.

Figure 1B:
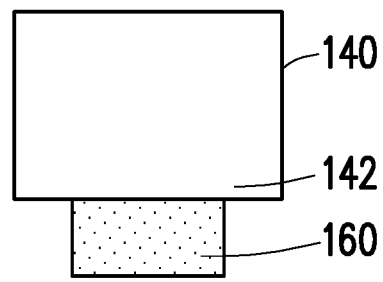
FIG. 1B is a schematic view of a micro-electronic element and a conductive connection pad according to an embodiment of the disclosure.
Figure 1C:
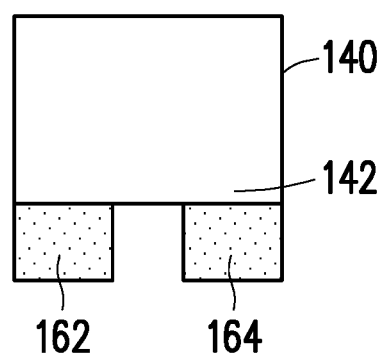
FIG. 1C is a schematic view of a micro-electronic element and conductive connection pads according to an embodiment of the disclosure.

In the present embodiment, a conductive connection pad 160 may be disposed on each of the micro-electronic elements 140. According to an embodiment of the disclosure, the light source device 130 may irradiate the conductive connection pads 160 to heat and soften the conductive connection pads 160 before the micro-electronic elements 140 are outputted from the first conveyer portion 110. When the micro-electronic elements 140 are outputted from the first conveyer portion 110, the micro-electronic elements 140 may be bonded to the bumps 150 through the conductive connection pads 160. Note that when heating and softening the conductive connection pads 160, the light source device 130 may perform heating and softening on a plurality of conductive connection pads 160 at the same time or on one conductive connection pad 160 only. Specific implementation is provided with reference to a second embodiment provided as follows. According to an embodiment of the disclosure, the light source device 130 heats the conductive connection pads 160 to a temperature range greater than a glass transition temperature ($T_g$) of the conductive connection pads 160 and less than a melting point ($T_m$) of the conductive connection pads 160 to soften the conductive connection pads 160. As such, a phase transition of the conductive connection pads 160 is between a glassy state and a molten liquid state and turns into a plastic state, a high viscosity state, or a rubber state. Nevertheless, the conductive connection pads 160 are not heated to a temperature greater than the melting point and thus are prevented from overflowing, but the disclosure is not limited thereto. Note that the conductive connection pads 160 may act as electrodes 160 of the micro-electronic elements 140. As shown in FIG. 1B, the conductive connection pad 160 is disposed on a semiconductor layer 142 of the micro-electronic element 140. The micro-electronic element 140 herein is a vertical micro-electronic element 140, for example. Nevertheless, as shown in FIG. 1C, the micro-electronic element 140 may be a horizontal or flip chip micro-electronic element 140, for example. At least two conductive connection pads are provided, including a first conductive connection pad 162 and a second conductive connection pad 164 electrically connected to a first semiconductor layer (not shown) and a second semiconductor layer (not shown) of the flip chip micro-electronic element 140 respectively.

Various implementations of the first conveyer portion 110 are provided in the embodiments as follows. It should be noted that the reference numerals and a part of the contents in the previous embodiment are used in the following embodiments, in which identical reference numerals indicate identical or similar components, and repeated description of the same technical contents is omitted. Please refer to the descriptions of the previous embodiment for the omitted contents, which will not be repeated hereinafter.

Figure 2:
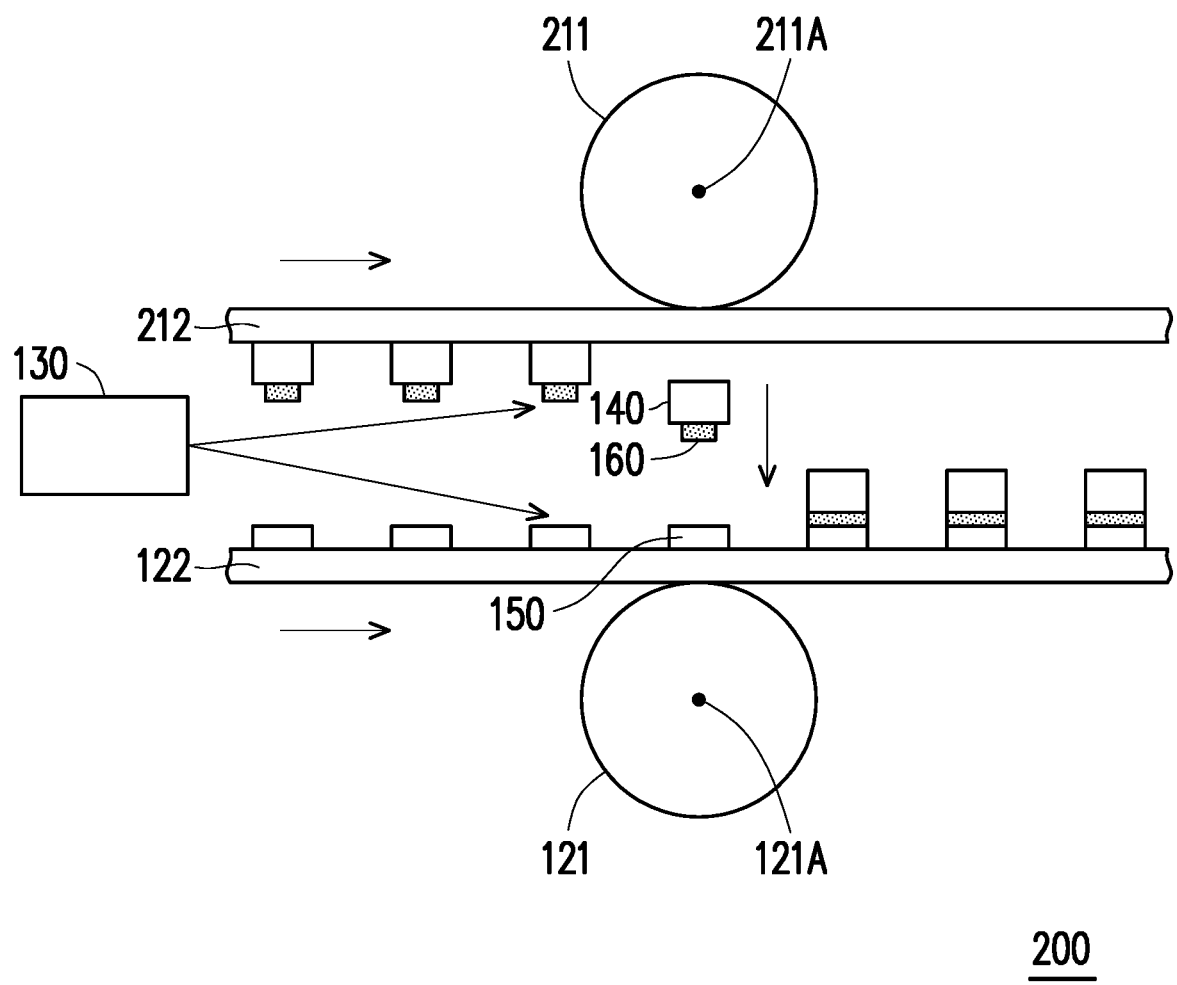
FIG. 2 is a schematic view of a micro-electronic element transfer apparatus according to a second embodiment of the disclosure.

With reference to FIG. 2 which illustrates a schematic view of a micro-electronic element transfer apparatus according to a second embodiment of the disclosure. A micro-electronic element transfer apparatus 200 includes a first conveyer portion 210, a second conveyer portion 120, and a light source device 130. A difference between the second embodiment and the first embodiment is that the first conveyer portion 210 includes a rolling component 211 and a carrier 212. Herein, the carrier 212 is disposed on the rolling component 211, and the micro-electronic elements 140 are disposed on the carrier 212. The rolling component 211 has a rolling component axle center 211A, and the rolling component 211 rolls (or rotates) with respect to the rolling component axle center 211A. The light source device 130 respectively irradiates a plurality of conductive connection pads 160 on the micro-electronic elements 140 to heat and soften these conductive connection pads 160. When these micro-electronic elements 140 are detached from the carrier 212, these micro-electronic elements 140 are bonded to plural bumps 150 on the substrate 122 through these conductive connection pads 160. As such, the micro-electronic elements 140 are allowed to be securely disposed on the substrate 122 and are connected to the bumps 150 respectively. According to an embodiment of the disclosure, the carrier 212 may include a photo-dissociation material (not shown) disposed between the carrier 212 and the micro-electronic elements 140. Further, ultraviolet light or laser light may be used to irradiate a portion of the carrier 212, so that adhesion between this portion of the carrier 212 and the micro-electronic elements 140 is reduced. In this way, the micro-electronic elements 140 on the carrier 212 are detached from the carrier 212. Ultraviolet light is preferably used when the photo-dissociation material is used, so that overheating that may affect the micro-electronic elements 140 in the irradiation process is prevented.

With reference to FIG. 3A to FIG. 3D, which illustrate schematic views of a micro-electronic element transfer apparatus according to a third embodiment of the disclosure. A micro-electronic element transfer apparatus 300 includes a first conveyer portion 310, a second conveyer portion 320, and a light source device 330. The first conveyer portion 310 includes a rolling component 311 and a carrier 312. Herein, the carrier 312 is flexible, and the carrier 312 conveys a plurality of micro-electronic elements 340 along with rolling of the rolling component 311. According to an embodiment of disclosure, the carrier may be implemented as a conveyer belt. In this embodiment, a connection pad 370 is further disposed on each of the plurality of micro-electronic elements 340, and the micro-electronic elements 340 are disposed on the carrier 312 respectively through the connection pads 370 disposed thereon. According to an embodiment of the disclosure, the connection pads 370 may include an organic material, such as epoxy resin, polyimide, polyester, polyurethane, benzocyclobutene, polyethylene, polypropylene, polyacrylate, and a combination of the foregoing, but the disclosure is not limited thereto.

The second conveyer portion 320 includes a rolling component 321 and a substrate 322. Herein, the substrate 322 is flexible, and the substrate 322 conveys a plurality of bumps 350 along with rolling of the rolling component 321. The light source device 330 includes a first light source 331 and a second light source 332. Herein, the first light source 331 is configured to heat and soften the bumps 350 on the substrate 322, and the second light source 332 may be disposed in the first conveyer portion 310 for heating and making the connection pads 370 on the micro-electronic elements 340 generate a phase transition.

Figure 3A:
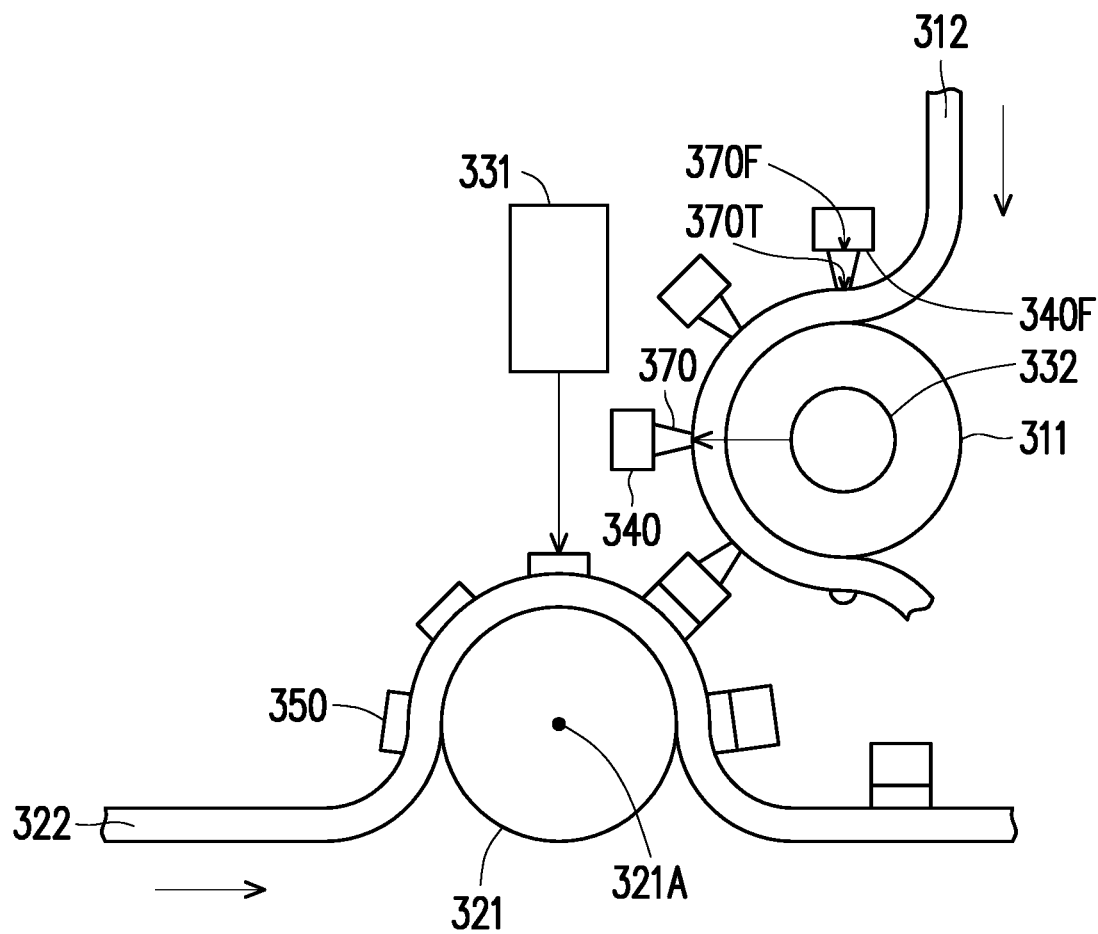
FIG. 3A to FIG. 3D are schematic views of a micro-electronic element transfer apparatus according to a third embodiment of the disclosure.

As shown in FIG. 3A, the second light source 332 heats and softens the connection pad 370. At the same time, the first light source 331 is used to heat and soften the corresponding bump 350 on the substrate 322. When the micro-electronic element 340 and the bump 350 are in contact with each other owing to rolling of the rolling component 311 and the rolling component 321, a connection force between the micro-electronic element 340 together with the connection pad 370 and the bump 350 is greater than a connection force between the micro-electronic element 340 together with the connection pad 370 and the carrier 312. As such, the micro-electronic element 340 is bonded to the bump 350 and is securely disposed on the substrate 322. A portion of the connection pad 370 may remain on the carrier 312 and does not remain on the micro-electronic element 340 in the phase transition process or may be removed later when the micro-electronic element 340 is bonded onto the bump 350, which is not limited therein. According to an embodiment of the disclosure, the second light source 332 heats the connection pad 370 to a temperature greater than the melting point of the connection pad 370, so that the connection pad 370 becomes soft and molten and may be detached from the carrier 312 easily, but the disclosure is not limited thereto. According to an embodiment of the disclosure, a conductive connection pad may be disposed on one side of each of the micro-electronic elements 340 opposite to the side provided with the connection pad 370. Further, the micro-electronic element 340 may be bonded to the bump 350 through this conductive connection pad.

In this embodiment, each connection pad 370 may include a first surface 370F connected to the micro-electronic element 340 and a second surface 370T configured to be connected to the carrier 312. Moreover, an area of the first surface 370F is greater than an area of the second surface 370T, so that the connection pad 370 may be easily detached from the carrier 312 after being bonded and may be easily detached from the micro-electronic element 340. In an embodiment, a ratio of the area of the second surface 370T to the area of the first surface 370F is less than 0.9, but the disclosure is not limited thereto. The areas of the first surface 370F and the second surface 370T may be the same. Note that the area of the first surface 370F may be less than an area of a connection surface 340F with the micro-electronic element 340. In an embodiment, the ratio of the area of the second surface 370T to the area of the first surface 370F is less than 0.9, so that the connection pad 370 may be easily detached from the micro-electronic element 340.

Figure 3B:
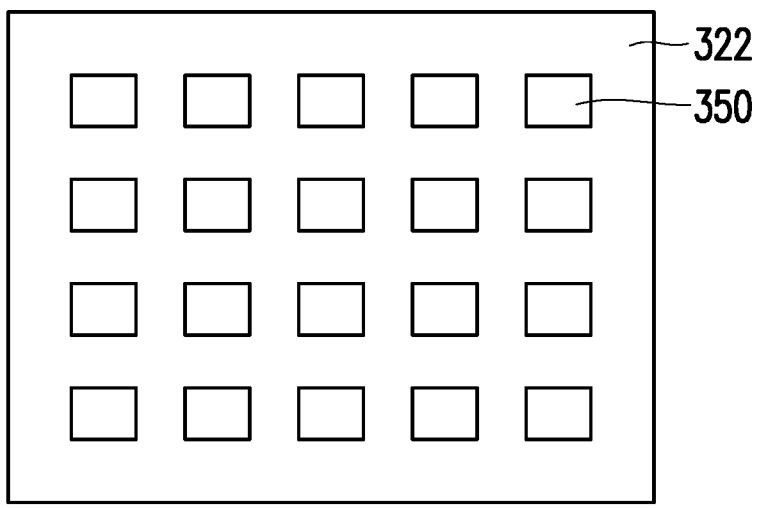

With reference to FIG. 3B next, which illustrates configuration of the bumps 350 on the substrate 322. As shown in FIG. 3B, these bumps 350 are arranged in a form of a matrix. According to an embodiment of the disclosure, the micro-electronic elements 340 on the carrier 312 in the micro-electronic element transfer apparatus 300 may also be disposed into the same matrix form, so that the micro-electronic elements 340 are correspondingly bonded to the bumps 350.

Figure 3C:
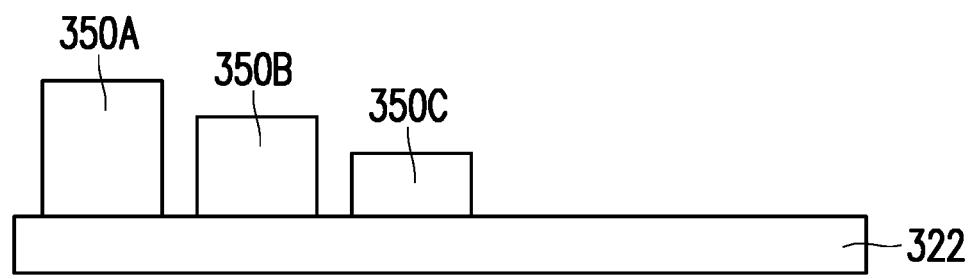

With reference to FIG. 3C, in this embodiment, the bumps 350 may include a bump 350A, a bump 350B, and a bump 350C of various heights. To be specific, in an embodiment, a plurality of micro-electronic elements 340 may be respectively bonded to the lowest bump 350C on the substrate 322. Next, the second-lowest bump 350B is disposed on the substrate 322, and a plurality of micro-electronic elements 340 of another light color are respectively bonded to the second-lowest bump 350B on the substrate 322. Finally, the bump 350A is disposed on the substrate 322, and a plurality of micro-electronic elements 340 of still another light color are respectively bonded to the highest bump 350A on the substrate 322. In this way, the micro-electronic elements 340 are prevented from affecting one another when being bonded. The micro-electronic elements 340 are all outputted to the bump 350A, the bump 350B, and the bump 350C on the substrate 322 respectively through the first conveyer portion 310. The micro-electronic elements 340 may include a blue micro light-emitting diode, a green micro light-emitting diode, a red micro light-emitting diode, and a combination thereof, but the disclosure is not limited thereto.

Figure 3D:
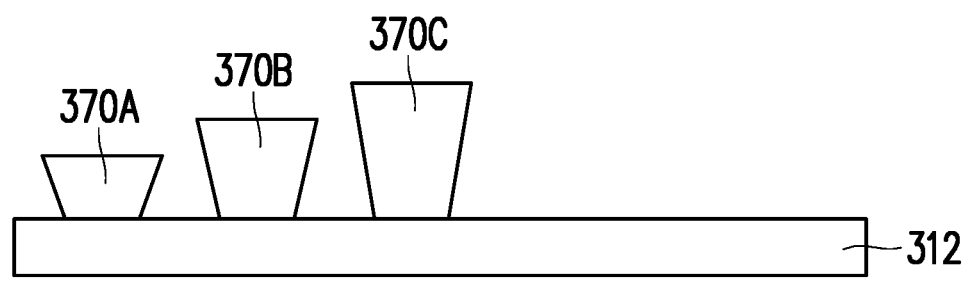

With reference to FIG. 3D, the connection pads 370 may also include a connection pad 370A, a connection pad 370B, and a connection pad 370C of different heights. To be specific, in an embodiment, a plurality of micro-electronic elements 340 may be disposed on first surfaces of a plurality of connection pads 370A to be respectively bonded to the bumps on the substrate 322. Next, a plurality of micro-electronic elements 340 of another color light may be disposed on first surfaces of a plurality of second-highest connection pads 370B to be respectively bonded to the bumps on the substrate 322. Finally, a plurality of micro-electronic elements 340 of still another color light may be disposed on first surfaces of plural highest connection pads 370C to be respectively bonded to the bumps on the substrate 322. In this way, the micro-electronic elements 340 are prevented from affecting one another when being bonded. The connection pads 370C and the micro-electronic elements 340 are all outputted to the bumps 350 on the substrate 322 respectively through the first conveyer portion 310. The micro-electronic elements 340 may include a blue micro light-emitting diode, a green micro light-emitting diode, a red micro light-emitting diode, and a combination thereof, but the disclosure is not limited thereto.

Figure 4:
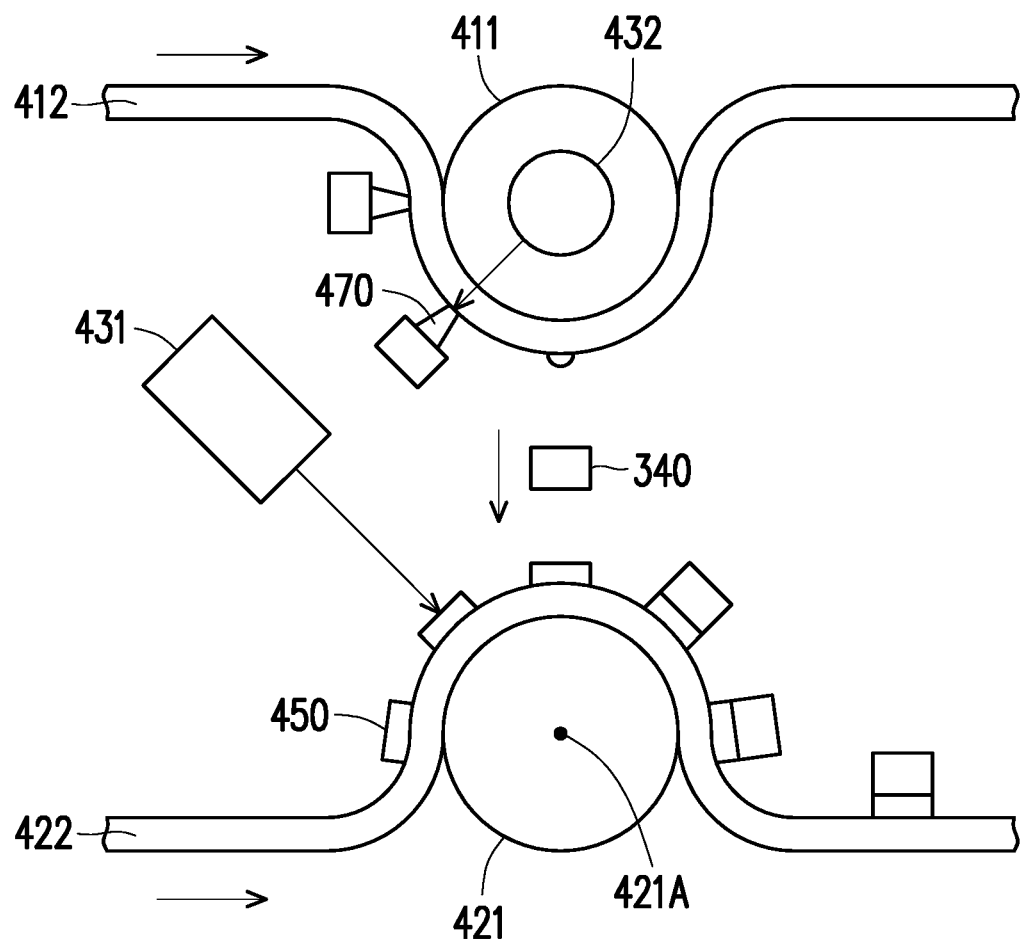
FIG. 4 is a schematic view of a micro-electronic element transfer apparatus according to a fourth embodiment of the disclosure.

With reference to FIG. 4 which illustrates a schematic view of a micro-electronic element transfer apparatus according to a fourth embodiment of the disclosure. A micro-electronic element transfer apparatus 400 includes a first conveyer portion 410, a second conveyer portion 420, and a light source device 430. The first conveyer portion 410 includes a rolling component 411 and a carrier 412. Herein, the carrier 412 is flexible, and the carrier 412 conveys the plurality of micro-electronic elements 340 along with rolling of the rolling component 411. A connection pad 470 is further disposed on each of the plurality of micro-electronic elements 340, and the micro-electronic elements 340 are disposed on the carrier 412 respectively through the connection pads 470 disposed thereon.

The second conveyer portion 420 includes a rolling component 421 and a flexible substrate 422, and the substrate 422 conveys a plurality of bumps 450 along with rolling of the rolling component 421. The light source device 430 includes a first light source 431 and a second light source 432. Herein, the first light source 431 is configured to heat and soften the bumps 450 on the substrate 422, and the second light source 432 may be disposed in the first conveyer portion 410 for heating and softening the connection pads 470 on the micro-electronic elements 340.

The second light source 432 heats and softens the connection pads 470, so that the corresponding micro-electronic elements 340 are detached from the carrier 412. The micro-electronic elements 340 detached from the carrier 412 then fall towards the flexible substrate 422 by gravity and are correspondingly bonded to the bumps 450 on the substrate 422. In this way, the micro-electronic elements 340 may be allowed to securely disposed on the substrate 422. The micro-electronic elements 340 may be prevented from being damaged owing to an excessive pressure during contact when being bonded through gravity.

Figure 5:
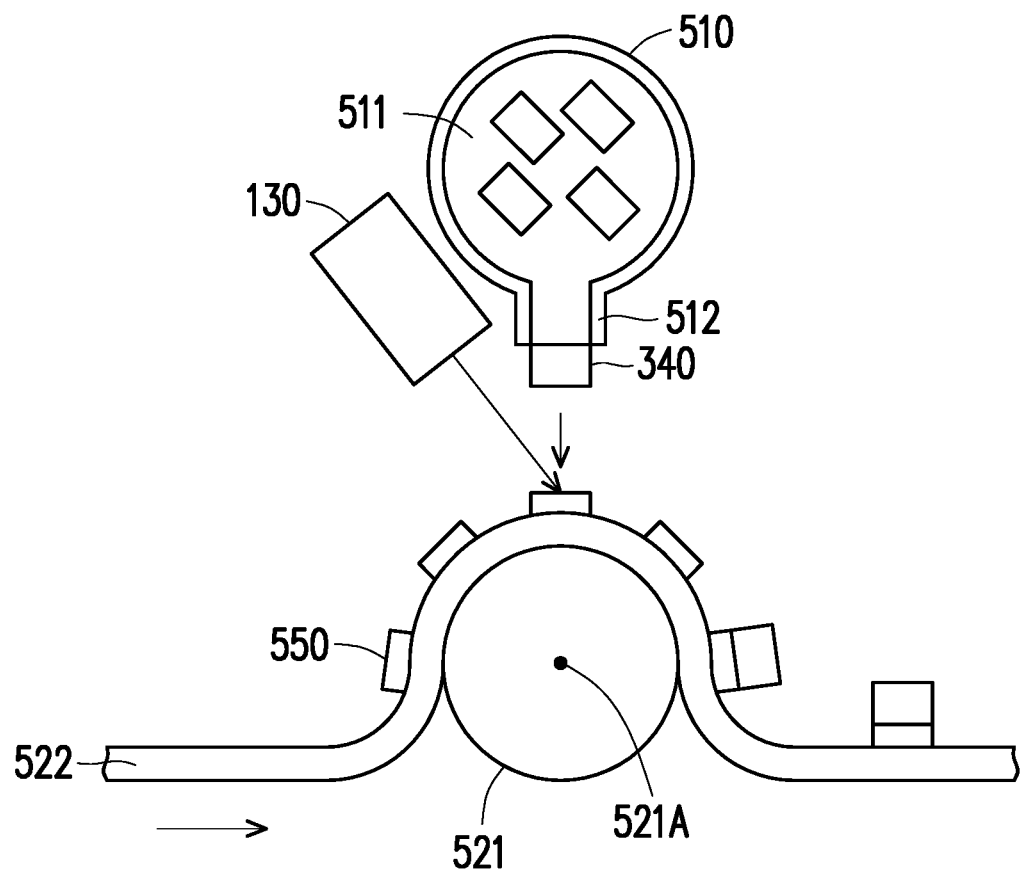
FIG. 5 is a schematic view of a micro-electronic element transfer apparatus according to a fifth embodiment of the disclosure.

With reference to FIG. 5 which illustrates a schematic view of a micro-electronic element transfer apparatus according to a fifth embodiment of the disclosure. A micro-electronic element transfer apparatus 500 includes a first conveyer portion 510, a second conveyer portion 520, and a light source device 130. The first conveyer portion 510 has a chamber 511 and at least one outlet 512. A fluid is loaded in the chamber 511, and the micro-electronic elements 340 are loaded in the chamber 511 and flow out in sequence from the outlet 512 through the fluid.

The second conveyer portion 520 includes a rolling component 521 and a flexible substrate 522, and the substrate 522 conveys a plurality of bumps 550 along with rolling of the rolling component 521. The light source device 130 is configured to heat and soften the bumps 550 on the substrate 522. According to an embodiment of the disclosure, the micro-electronic element transfer apparatus 500 may further include an additional light source device (not shown). The additional light source device is configured to heat the micro-electronic elements 340 flowing out from the outlet 512 to accelerate evaporation of the fluid remaining on the micro-electronic elements 340.

After flowing out from the outlet 512, the micro-electronic elements 340 fall by gravity and are bonded to the bumps 550 on the substrate 522, so as to be securely disposed on the substrate 522. According to an embodiment of the disclosure, the bumps 550 may be disposed into a matrix form on the substrate 522. The first conveyer portion 510 has a plurality of outlets 512, and the outlets 512 are configured into the same matrix manner. The micro-electronic elements 340 are outputted from the outlets 512, bonded to the bumps 550, and are securely disposed on the substrate 522.

Figure 6:
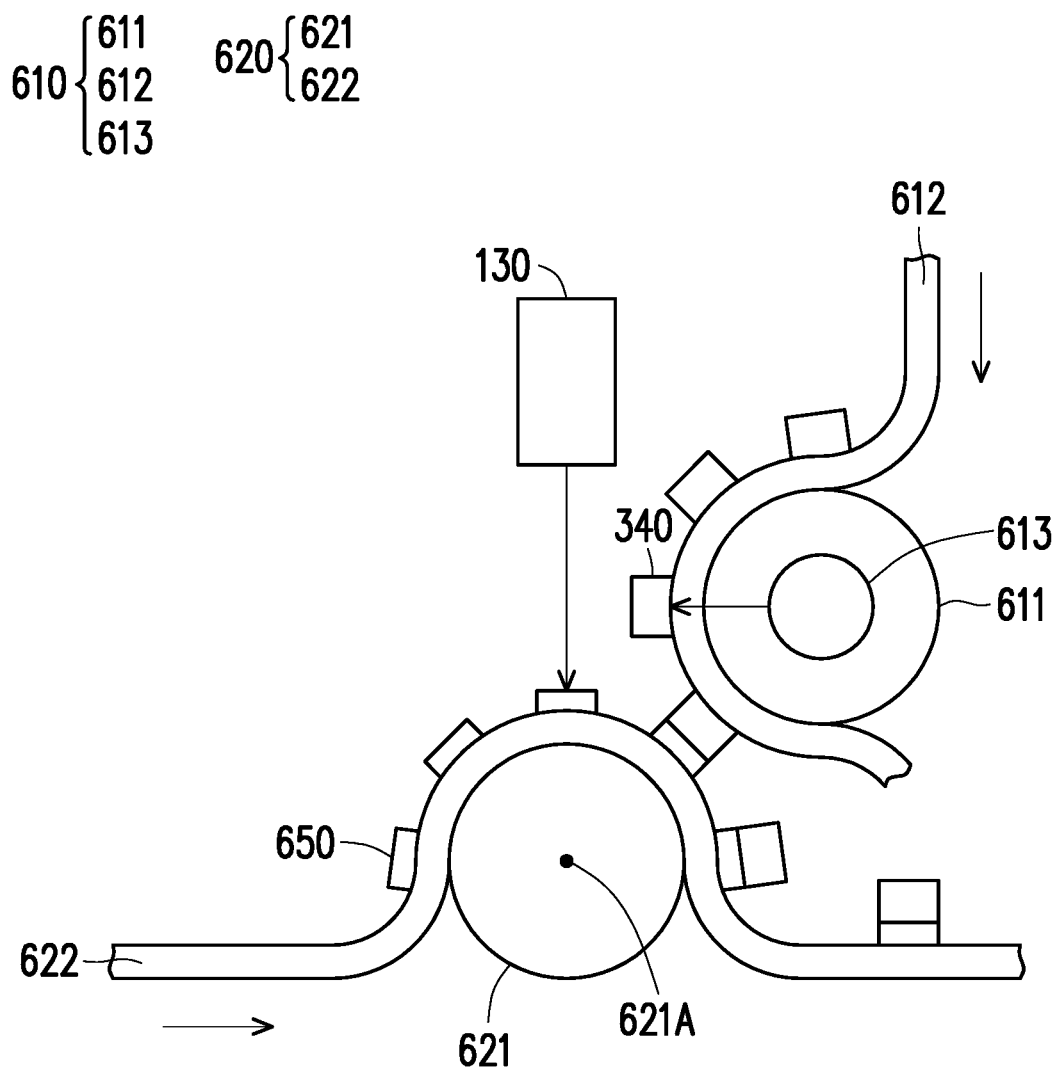
FIG. 6 is a schematic view of a micro-electronic element transfer apparatus according to a sixth embodiment of the disclosure.

With reference to FIG. 6 which illustrates a schematic view of a micro-electronic element transfer apparatus according to a sixth embodiment of the disclosure. A micro-electronic element transfer apparatus 600 includes a first conveyer portion 610, a second conveyer portion 620, and a light source device 130. The first conveyer portion 610 includes a rolling component 611, a carrier 612, and an ultraviolet light device 613. The carrier 612 is flexible and includes a photo-dissociation material. The ultraviolet light device 613 is configured to irradiate a local region of the carrier 612 with light, e.g. ultraviolet light or laser light. As such, a dissociation reaction occurs in such local region of the carrier 612, and a transition in material properties is generated. An adhesion force between this local region and the micro-electronic elements 340 disposed thereon is thereby reduced. Ultraviolet light is preferably used, so that overheating that may affect the micro-electronic elements 340 in the irradiation process is prevented.

The second conveyer portion 620 includes a rolling component 621 and a substrate 622. Herein, the substrate 622 is flexible, and the substrate 622 conveys a plurality of bumps 650 along with rolling of the rolling component 621. The light source device 130 is configured to heat and soften the bumps 650 on the substrate 622.

As shown in FIG. 6, when the ultraviolet light device 613 irradiates the local region of the carrier 612 with ultraviolet light, an adhesion force between the micro-electronic element 340 on this local region and the carrier 612 drops. At the same time, the light source device 130 is used to heat and soften the corresponding bump 650 on the substrate 622. When the micro-electronic element 340 and the bump 650 are in contact with each other owing to rolling of the rolling component 611 and the rolling component 621, an adhesion force between the micro-electronic element 340 and the bump 650 is greater than an adhesion force between the micro-electronic element 340 and the carrier 612. As such, the micro-electronic element 340 is bonded to the bump 650 and is securely disposed on the substrate 622.

Figure 7:
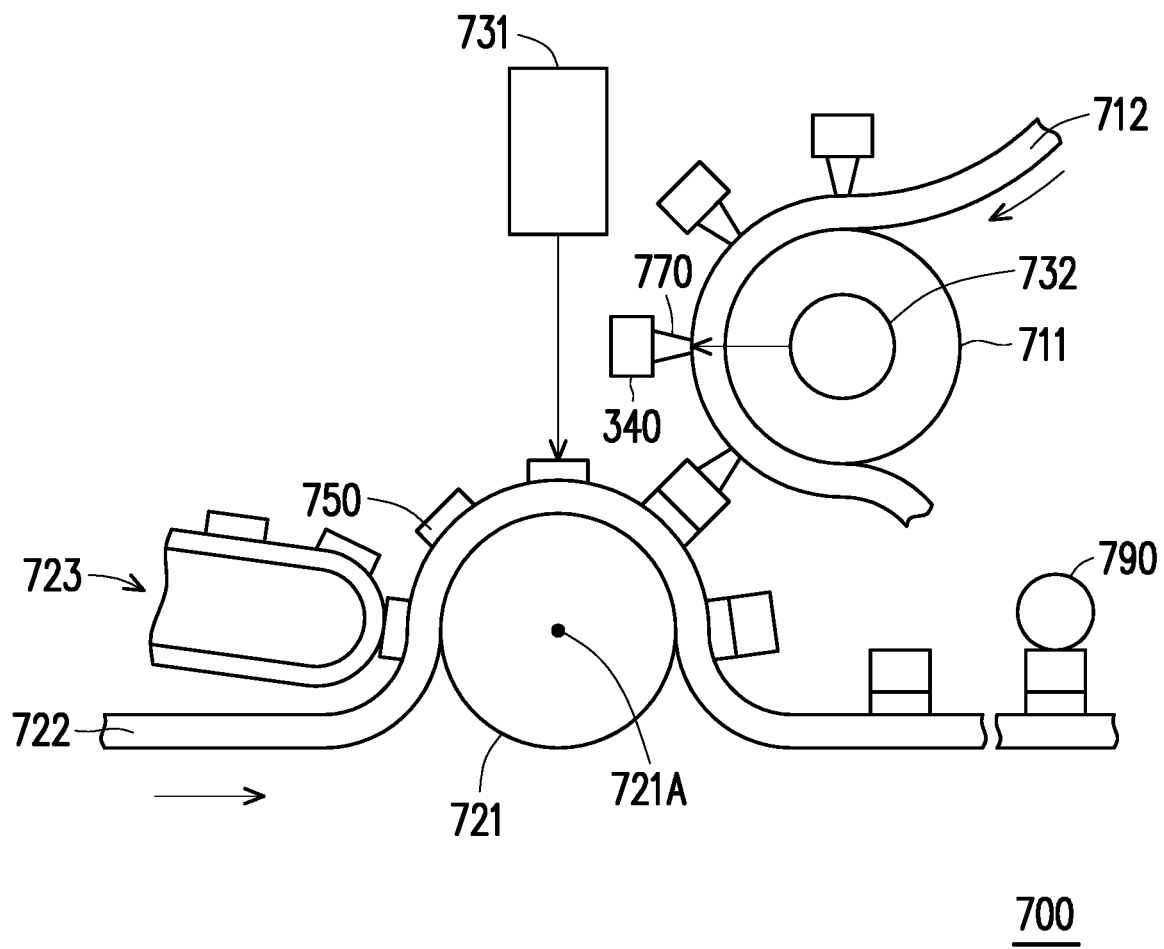
FIG. 7 is a schematic view of a micro-electronic element transfer apparatus according to a seventh embodiment of the disclosure.

With reference to FIG. 7 which illustrates a schematic view of a micro-electronic element transfer apparatus according to a seventh embodiment of the disclosure. A micro-electronic element transfer apparatus 700 includes a first conveyer portion 710, a second conveyer portion 720, and a light source device 730. The first conveyer portion 710 includes a rolling component 711 and a carrier 712. The carrier 712 conveys the plurality of micro-electronic elements 340 along with rolling of the rolling component 711. In this embodiment, a connection pad 770 is further disposed on each of the plurality of micro-electronic elements 340, and the micro-electronic elements 340 are disposed on the carrier 712 respectively through the connection pads 770 disposed thereon.

The second conveyer portion 720 includes a rolling component 721, a substrate 722, a conveyer belt 723, and a pressing component 790. Herein, the substrate 722 may be a flexible substrate. The conveyer belt 723 conveys a plurality of bumps 750 onto the substrate 722, and the substrate 722 conveys the bumps 750 along with rolling of the rolling component 721. The light source device 730 includes a first light source 731 and a second light source 732. Herein, the first light source 731 is configured to heat and soften the bumps 750 on the substrate 722, and the second light source 732 may be disposed in the first conveyer portion 710 for heating and softening the connection pads 770 on the micro-electronic elements 340. According to an embodiment of the disclosure, the bumps 750 may be produced through a 3D printer and are disposed on the substrate 722, but the disclosure is not limited thereto.

As shown in FIG. 7, the second light source 732 heats and softens the connection pad 770. At the same time, the first light source 731 is used to heat and soften the corresponding bump 750 on the substrate 722. When the micro-electronic element 340 and the bump 750 are in contact with each other owing to rolling of the rolling component 711 and the rolling component 721, an adhesion force between the micro-electronic element 340 together with the connection pad 770 and the bump 750 is greater than an adhesion force between the micro-electronic element 340 together with the connection pad 770 and the carrier 712. In this way, the micro-electronic element 340 together with the connection pad 770 are bonded to the bump 750, and the pressing component 790 is then used to press all three of the connection pad 770, the micro-electronic element 340, and the bump 750, so that these three may be securely disposed on the substrate 722. According to an embodiment of the disclosure, the pressing component 790 may be a roller, but the disclosure is not limited thereto.

Figure 8:
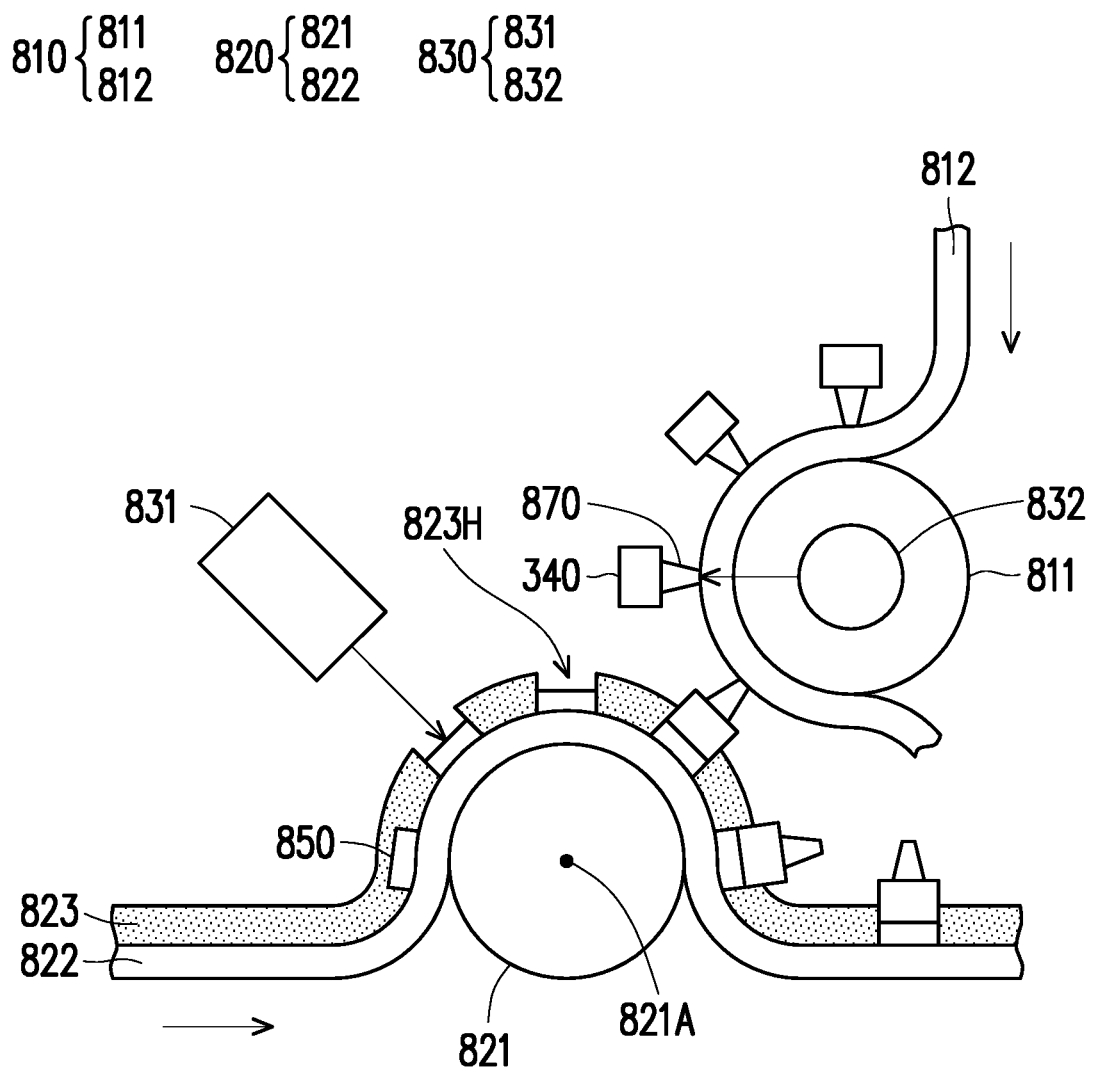
FIG. 8 is a schematic view of a micro-electronic element transfer apparatus according to an eighth embodiment of the disclosure.

With reference to FIG. 8 which illustrates a schematic view of a micro-electronic element transfer apparatus according to an eighth embodiment of the disclosure. A micro-electronic element transfer apparatus 800 includes a first conveyer portion 810, a second conveyer portion 820, and a light source device 830. The first conveyer portion 810 includes a rolling component 811 and a carrier 812. Herein, the carrier 812 is flexible, and the carrier 812 conveys the plurality of micro-electronic elements 340 along with rolling of the rolling component 811. A connection pad 870 is further disposed on each of the plurality of micro-electronic elements 340, and the plurality of micro-electronic elements 340 are disposed on the carrier 812 respectively through the connection pads 870 configured thereon.

The second conveyer portion 820 includes a rolling component 821 and a substrate 822. Herein, the substrate 822 is flexible, and the substrate 822 conveys a plurality of bumps 850 along with rolling of the rolling component 821. Note that an adhesion layer 823 is disposed on the substrate 822, and the adhesion layer 823 covers the bumps 850. The light source device 830 includes a first light source 831 and a second light source 832. Herein, the first light source 831 is configured to burn and melt portions of the adhesion layer 823 corresponding to the bumps 850, so that a plurality of via holes 823H are formed through burning and melting. As such, each of the bumps 850 is exposed from the via hole 823H, and the exposed bumps 850 are further heated and softened. The second light source 832 may be disposed in the first conveyer portion 810 for heating and softening the connection pads 870 on the micro-electronic elements 340.

As shown in FIG. 8, the second light source 832 heats and softens the connection pad 870. At the same time, the portions of the adhesion layer 823 are burned and melted by the first light source 831 to generate the via holes 823H, the bumps 850 are exposed from the via holes 823H, and the exposed bumps 850 are further heated and softened. When the micro-electronic element 340 and the bump 850 are in contact with each other owing to rolling of the rolling component 811 and the rolling component 821, an adhesion force between the micro-electronic element 340 together with the connection pad 870 and the bump 850 is greater than an adhesion force between the micro-electronic element 340 together with the connection pad 870 and the carrier 812. As such, the micro-electronic element 340 together with the connection pad 870 are bonded to the bump 850 and are securely disposed on the substrate 322. Herein, a width of the via hole 823H is slightly greater than a width of the corresponding micro-electronic element 340. In addition, since the first light source 831 burns and melts the portions of the adhesion layer 823 corresponding to the bumps 850 only, a remaining portion of the adhesion layer 823 is not heated and burned. In this way, all three of the bonded connection pads 870, the micro-electronic elements 340, and the bumps 850 are allowed to be supported by the remaining portion of the adhesion layer 823 without being skewed and thus are securely disposed on the substrate 822.

Figure 9:
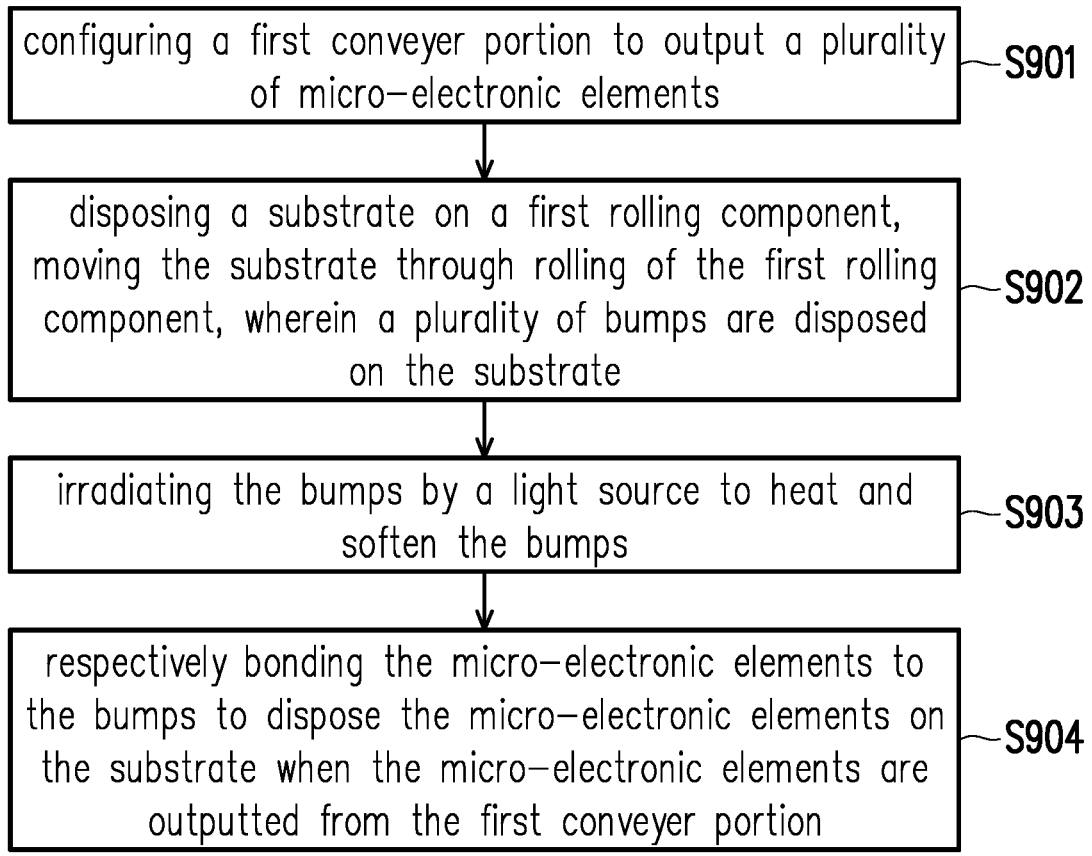
FIG. 9 is a flow chart of a micro-electronic element transfer method according to a ninth embodiment of the disclosure.

With reference to FIG. 9 which illustrates a flow chart of a micro-electronic element transfer method according to a ninth embodiment of the disclosure. A micro-electronic element transfer method 900 provided by the ninth embodiment is applicable to the micro-electronic element transfer apparatus provided by any one of the foregoing embodiments. The micro-electronic element transfer method 900 provided as follows is described with reference to the micro-electronic element transfer apparatus 100 of FIG. 1A.

The micro-electronic element transfer method 900 includes the following step. The first conveyer portion 110 is configured to output the plurality of micro-electronic elements 140 (step S901). The substrate 122 is disposed on the first rolling component 121, the substrate 122 is moved through rolling of the first rolling component 121, and the plurality of bumps 150 are disposed on the substrate 122 (step S902). The light source device 130 irradiates the bumps 150 to heat and soften the bumps 150 (step S903). Further, when the micro-electronic elements 140 are outputted from the first conveyer portion 110, the micro-electronic elements 140 are respectively bonded to the bumps 150, so that the micro-electronic elements 140 are disposed on the substrate 122 (step S904). Detailed steps of the micro-electronic element transfer method 900 may be found with reference to the detailed description of the micro-electronic element transfer apparatus provided in foregoing embodiments, and repeated description is thus not provided herein.

In view of the foregoing, in the micro-electronic element transfer apparatus and the micro-electronic element transfer method provided by the disclosure, the first conveyer portion is configured to output a plurality of micro-electronic elements, the substrate is configured to convey a plurality of bumps, and the light source device is configured to heat and soften the bumps. Therefore, the micro-electronic elements are disposed on the substrate through the bumps, the micro-electronic elements are efficiently transferred from the first conveyer portion to the substrate, and favorable transfer accuracy (position accuracy) of the micro-electronic elements is provided.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A micro-electronic element transfer method, comprising:

configuring a first conveyer portion to output a plurality of micro-electronic elements;

disposing a substrate on a first rolling component, moving the substrate through rolling of the first rolling component, wherein a plurality of bumps are disposed on the substrate;

irradiating the bumps for heating by a light source device so that the bumps generate a phase transition; and respectively bonding the micro-electronic elements to the bumps when the micro-electronic elements are outputted from the first conveyer portion, wherein a connection force between the micro-electronic elements and the first conveyer portion is less than a connection force between the micro-electronic elements and the bumps so as to dispose the micro-electronic elements on the substrate.

2. The micro-electronic element transfer method according to claim 1, further comprising:

disposing a conductive connection pad on each of the micro-electronic elements;

irradiating the conductive connection pads for heating by the light source device so that the conductive connection pads generate a phase transition; and respectively bonding the conductive connection pads between the micro-electronic elements and the bumps when the micro-electronic elements are outputted from the first conveyer portion.

3. The micro-electronic element transfer method according to claim 1, further comprising:

configuring a second rolling component and a carrier, wherein the micro-electronic elements are disposed on the carrier; and disposing the carrier on the second rolling component and conveying the micro-electronic elements through rolling of the second rolling component.

4. The micro-electronic element transfer method according to claim 3, further comprising:

disposing a connection pad on each of the micro-electronic elements, wherein the micro-electronic elements are disposed on the carrier through the connection pads; and irradiating the connection pads for heating by the light source device so that the connection pads generate a phase transition and the micro-electronic elements are outputted from the first conveyer portion.

5. The micro-electronic element transfer method according to claim 3, further comprising:

configuring the carrier to comprise a photo-dissociation material; and irradiating the carrier by the light source device so that the micro-electronic elements is detached from the carrier and is outputted from the first conveyer portion.

6. The micro-electronic element transfer method according to claim 1, further comprising:

disposing an adhesion layer on the substrate and the bumps; and irradiating the adhesion layer by the light source device to form via holes corresponding to the bumps on the adhesion layer through burning and melting.

7. The micro-electronic element transfer method according to claim 1, further comprising:

heating the bumps to a temperature greater than a glass transition temperature of the bumps and less than a melting point temperature of the bumps by the light source device.

8. The micro-electronic element transfer method according to claim 2, further comprising:

heating the conductive connection pads to a temperature greater than a glass transition temperature of the conductive connection pads and less than a melting point temperature of the conductive connection pads by the light source device.

* * * * *